United States Patent [19]

Korb

[11] 3,868,586

[45] Feb. 25, 1975

[54] DIFFERENTIAL AMPLIFIER HAVING A SHORT RESPONSE TIME

[75] Inventor: Harold Wilfred Korb, Allentown, Pa.

[73] Assignee: Bell Telephone Laboratories, Incorporated, Murray Hill, N.J.

[22] Filed: Nov. 23, 1973

[21] Appl. No.: 418,669

[52] U.S. Cl. ........... 330/30 D, 307/235, 307/299 A, 330/69

[51] Int. Cl. ................................................ H03f 3/68

[58] Field of Search .................. 330/30 D, 30 R, 69; 307/235, 299 A

[56] References Cited

UNITED STATES PATENTS

| | | | |
|---|---|---|---|
| 3,477,031 | 11/1969 | Nagata | 330/30 D |
| 3,676,712 | 7/1972 | Schendel, Jr. | 307/299 A |
| 3,735,151 | 5/1973 | Frederiksen et al. | 330/30 D |
| 3,742,377 | 6/1973 | Dobkin | 330/30 D |

*Primary Examiner*—Stanley D. Miller, Jr.

*Attorney, Agent, or Firm*—Donnie E. Snedeker

[57] ABSTRACT

A differential amplifier is provided with a short response time by output circuitry which combines each component of an intermediate differential signal, generated via known techniques, with an auxiliary signal component in phase therewith. The output circuitry illustratively comprises a pair of multi-emitter output transistors. Each component of the intermediate signal and the component of the auxiliary signal in phase therewith are provided at respective emitters of one of the output transistors.

10 Claims, 1 Drawing Figure

PATENTED FEB 25 1975 3,868,586
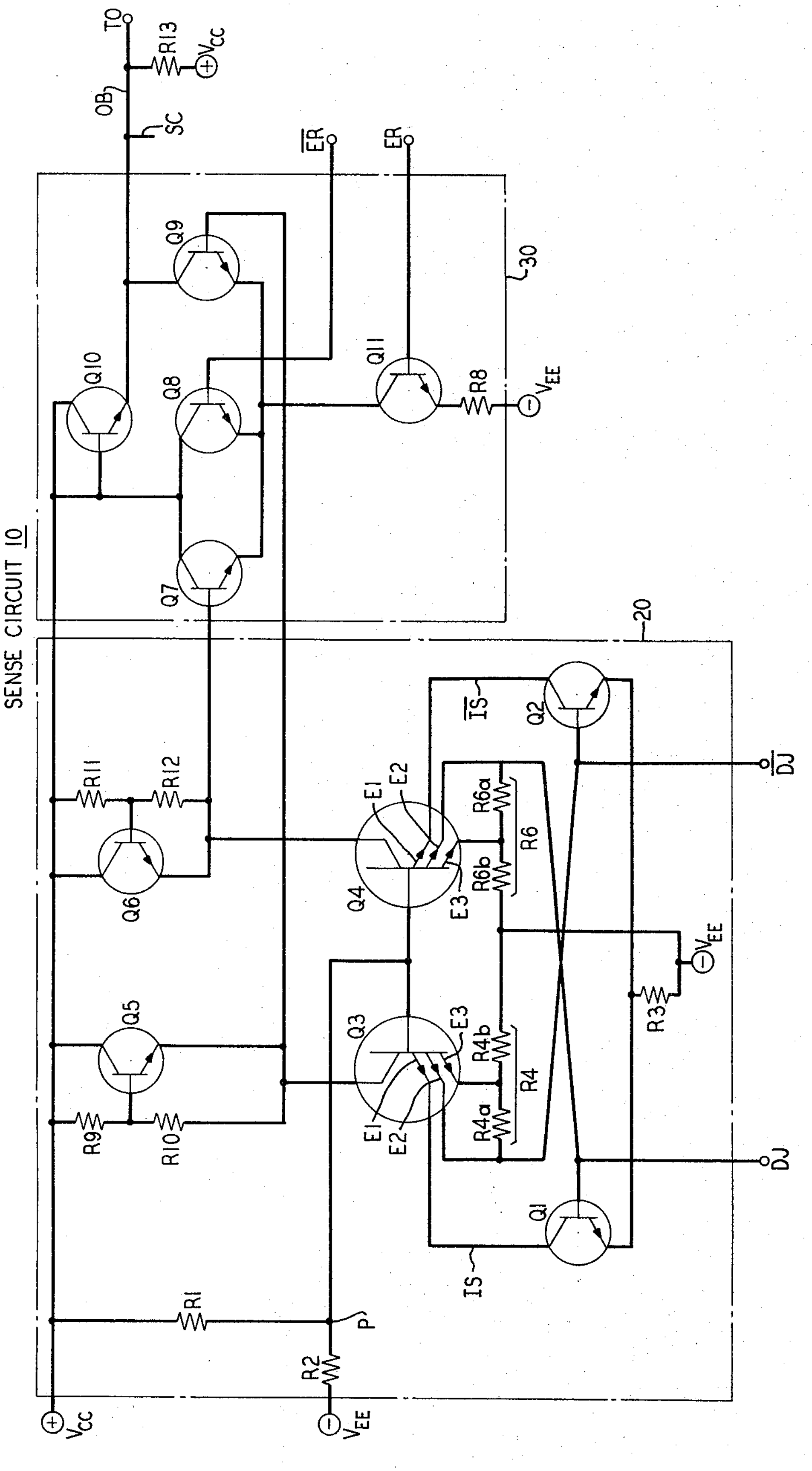

DIFFERENTIAL AMPLIFIER HAVING A SHORT RESPONSE TIME

BACKGROUND OF THE INVENTION

My invention relates generally to differential amplifiers and in particular, to differential amplifiers which have short response times.

Differential amplifiers perform a wide variety of functions in modern analog and digital systems. In many of these systems, the speed with which the amplifier responds to input stimuli is of substantial importance. For example, differential amplifiers are routinely used to sense the states of individual memory cells in a semiconductor memory. Since the access time of a high-speed semiconductor memory is largely determined by the speed with which its sense circuitry operates, it is important that the response time of sense circuit differential amplifiers be as short as possible.

The response time of a differential amplifier has several components. One of these, the input rise time, is the time required for the inherent and stray capacitances shunted across the input leads to charge to new values in response to a change in input signal. Another component of the response time is the propagation delay, which is the time required for the output signal to respond to the input signal change once the above-mentioned input capacitances have been effectively charged. In order to ensure as short a differential amplifier response time as possible, it is desirable to provide both a short propagation delay and a short input rise time.

SUMMARY OF THE INVENTION

Accordingly, a general object of the present invention is to provide an improved differential amplifier.

A more specific object of the invention is to provide a differential amplifier having a short response time.

A further object of the invention is to provide a differential amplifier having a short propagation delay.

Another object of the invention is to provide a differential amplifier having a short input rise time.

A differential amplifier achieving these and other objects may illustratively employ conventional differential input circuitry of a type operative in response to an input signal to generate an intermediate differential signal, from which an output signal is normally generated. However, in accordance with the invention, the output differential signal is generated by output circuitry which combines each component of the intermediate differential signal with an auxiliary signal component in phase therewith. The output differential signal generated thereby responds to the input signal at a faster rate than the normal output signal generated directly from the intermediate signal since each auxiliary signal component functions within the output circuitry to reinforce signal level excursions of the intermediate signal component with which that auxiliary signal component is combined. Consequently, it will be appreciated that the present invention provides substantially shorter differential amplifier propagation delay than is generally provided in the prior art.

In an illustrative embodiment of the invention, the above-mentioned output circuitry includes a pair of output transistors each having at least two emitters. A first intermediate signal component and the auxiliary signal component in phase therewith respectively control the first-emitter and second-emitter currents of one of the output transistors. Similarly, a second intermediate signal component and the auxiliary signal component in phase therewith respectively control the first-emitter and second-emitter currents of the other output transistor. The differential output signal is taken at the collectors of the output transistors.

In the illustrative embodiment, a path for a substantial portion of the second-emitter current of each output transistor is provided through a resistance connecting the second emitter to $V_{EE}$. The magnitude of this resistance is a principal determinant of the differential amplifier input resistance and hence its input rise time. If, in order to minimize the input rise time, a small value for this connecting resistance is used, the current flowing through $V_{EE}$ and thus the power dissipation of the amplifier as a whole are, disadvantageously, increased.

However, in accordance with an aspect of the invention, a low effective input resistance, and hence short input rise time, are advantageously provided concurrently with a low current flow to $V_{EE}$. As explained in detail hereinbelow, this is achieved illustratively by providing each output transistor with a third emitter. The third emitter of each output transistor is connected to the second emitter thereof via relatively small resistance and to $V_{EE}$ via a relatively large resistance.

DESCRIPTION OF THE DRAWING

The invention may be clearly understood from a consideration of the following detailed description and accompanying drawing in which the sole FIGURE depicts a differential amplifier embodying the principles of the present invention, illustratively employed in a semiconductor memory sense circuit.

DETAILED DESCRIPTION

Sense circuit 10 depicted in the drawing comprises differential amplifier 20, which embodies the principles of my invention, and output stage 30. The latter converts the differential output signal of amplifier 20 into an unbalanced signal.

Amplifier 20 is responsive to the sense, i.e., polarity, of an input differential signal on digit lines DJ and $\overline{DJ}$. The two digit lines illustratively comprise a complementary bit line pair in a semiconductor memory. The cells of the memory may be of the type shown, for example, in R. M. Englund U.S. Pat. No. 3,553,659. If the signal (voltage or current) on digit line DJ is greater than that on digit line $\overline{DJ}$, indicating that an addressed one of a plurality of memory cells associated with digit lines DJ and $\overline{DJ}$ is in its 1 state, amplifier 20 extends an output differential signal of a first sense to stage 30. In response thereto, stage 30 provides a "high" voltage level at terminal TO. If, on the other hand, the sense of the amplifier 20 output signal is the opposite of that just assumed, indicating that the above-mentioned addressed memory cell is in its 0 state, a "low" voltage level is provided at terminal TO.

Amplifier 20 illustratively includes input transistors Q1 and Q2 and output transistors Q3 and Q4. In conventional manner, digit lines DJ and $\overline{DJ}$ are connected to the bases of input transistors Q1 and Q2, respectively, while the emitters of transistors Q1 and Q2 are connected in common to $V_{EE}$ via resistor R3. Output transistor Q3 has a first emitter E1 which is connected to the collector of transistor Q1 via lead IS. Output transistor Q4 has a first emitter E1 connected to the collector of transistor Q2 via lead $\overline{IS}$. The emitter E1 currents of transistors Q3 and Q4 are thus identical with the collector currents of transistors Q1 and Q2, respectively. The bases of transistors Q3 and Q4 are maintained at a substantially fixed potential via connection thereof to center point P of a voltage divider comprising resistors R1 and R2. The differential output signals are provided at the collectors of transistors Q3 and Q4.

The structure of amplifier 20 thus far described will be recognized as a conventional cascode differential amplifier, as disclosed, for example, in U.S. Pat. Nos. 3,482,177 and 3,541,465. Since the bases of output transistors Q3 and Q4 are at a fixed potential, the emitter potentials thereof and hence the collector potentials of input transistors Q1 and Q2 are also relatively fixed. Thus the voltage gains of transistors Q1 and Q2 are small. Inasmuch as the Miller capacitances seen at the bases of transistors Q1 and Q2 are functions of voltage gain, utilization of a cascode structure in amplifier 20 minimizes those Miller capacitances and thus advantageously helps to provide a shorter input rise time than other types of differential amplifier configurations.

The response time of amplifier 20 is further minimized in known fashion by utilizing a clamping network comprising transistor Q5 and resistors R9 and R10 to connect the collector of output transistor Q3 to $V_{CC}$. This clamping network functions when transistor Q3 is in a highly conductive state to clamp the collector of transistor Q3 to a predetermined potential, illustratively ($V_{CC}$ – 1.5 $V_{BE}$). Transistor Q3 is thus prevented from entering saturation, and is enabled for rapid switching from a conductive to a nonconductive state.

Output transistor Q4 is similarly enabled for rapid switching by a clamping network comprising transistor Q6 and resistors R11 and R12.

The operation of the conventional cascode differential amplifier thus far described will now be described briefly. Differential amplifier 20 is symmetric about a vertical axis. Thus if the magnitude of the differential input signal is zero, i.e., digit lines DJ and $\overline{DJ}$ carry equal signals or are effectively floating, input transistors Q1 and Q2 reside in substantially equal conductive states. Equal currents are drawn out of emitters E1 of output transistors Q3 and Q4 via leads IS and $\overline{IS}$, respectively. Thus, the respective potentials at the collectors of output transistors Q3 and Q4 are equal.

If a nonzero differential signal is subsequently provided on digit lines DJ and $\overline{DJ}$ so that the signal on digit line DJ, for example, is increased and that on $\overline{DJ}$ is decreased, differential action is initiated. The increased signal on digit line DJ increases the collector current of transistor Q1. Concurrently, as the base potential of transistor Q1 increases, its emitter potential correspondingly increases. A rising potential is thus provided at the emitter of transistor Q2. This rising potential operates in conjunction with the falling potential at the base of transistor Q2 to bias transistor Q2 in a reverse sense. The collector current of transistor Q2 decreases.

An intermediate differential signal is thus generated on leads IS and $\overline{IS}$. The component thereof on lead IS causes an increase in the emitter E1 current of output transistor Q3 and hence in the collector current thereof. Similarly, the component of the intermediate differential signal on lead $\overline{IS}$ causes a decrease in the emitter E1 current of output transistor Q4 and hence in the collector current of that transistor. The potential at the collector of transistor Q3 decreases and the potential at the collector of transistor Q4 increases.

An output differential signal of a first sense is thus provided at the collectors of transistors Q3 and Q4. It will be appreciated that if the sense of the signal on digit lines DJ and $\overline{DJ}$ is reversed from that assumed above, the sense of the output differential signal will also reverse.

In accordance with the present invention, differential amplifier 20 is provided with a shorter propagation delay than differential amplifiers generally known heretofore by utilizing output transistors Q3 and Q4, for example, to additively combine each component of the intermediate differential signal with an auxiliary signal component in phase therewith — the latter being developed from the input signal on digit lines DJ and $\overline{DJ}$.

Referring to the illustrative embodiment, each of output transistors Q3 and Q4 is seen to include a second emitter E2. Emitter E2 of transistor Q3 is connected to digit line $\overline{DJ}$ while emitter E2 of transistor Q4 is connected to digit line DJ. Thus, in accordance with the invention, each emitter E2 current comprises an auxiliary signal component controlled by the input signal on one or the other of the digit lines.

A path for current flowing from emitter E2 of transistor Q3 to $V_{EE}$ is provided by resistance R4. The latter comprises resistors R4*a* and R4*b*. In similar fashion, a path for current flowing from emitter E2 of transistor Q4 to $V_{EE}$ is provided by resistance R6, which comprises resistors R6*a* and R6*b*.

Now assume that, as before, the signal on digit line DJ increases and that on digit line $\overline{DJ}$ decreases. As described above, differential action causes the intermediate signal components on leads IS and $\overline{IS}$ to increase and decrease, respectively. At the same time, the increased signal on digit line DJ tends to reverse bias the base-emitter E2 junction of transistor Q4. The emitter E2 current of transistor Q4 is thus decreased in phase with the emitter E1 current thereof. Thus, when the emitter E1 and the emitter E2 currents of transistor Q4 are additively combined in transistor Q4, the collector current thereof decreases at a faster rate than it would if it were controlled by the emitter E1 signal alone.

Meanwhile, the decreased signal on digit line $\overline{DJ}$ tends to forward bias the base-emitter E2 junction of transistor Q3. The emitter E2 current of transistor Q3 is thus increased in phase with the emitter E1 current thereof. The additive combination of the emitter E1 and emitter E2 signals of transistor Q3 causes the collector current of transistor Q3 to increase at a faster rate than it would if it were controlled in conventional manner by the emitter E1 signal alone. Consequently, it is seen that the present invention provides a differential amplifier having a substantially shorter propagation delay than is generally provided in known arrangements.

As discussed above, the response time of a differential amplifier depends upon input rise time as well as propagation delay. One straightforward approach for providing a short input rise time for amplifier 20, for example, would be to provide small values for resistances R4 and R6, thereby minimizing the time constants associated with the respective input capacitances. However, the smaller the values of resistances R4 and R6, the greater the current flowing therethrough to $V_{EE}$ and thus the greater the power dissipation of the amplifier.

In accordance with an aspect of the invention, a short input rise time is provided for amplifier 20 without increasing the power dissipation thereof. Illustratively, transistors Q3 and Q4 are each provided with a third emitter E3. Emitter E3 of transistor Q3 is connected to the junction of resistors R4*a* and R4*b* and, similarly, emitter E3 of transistor Q4 is connected to the junction of resistors R6*a* and R6*b*. This arrangement makes the input resistances respectively presented to signals on digit lines DJ and $\overline{DJ}$ relatively independent of the values of resistors R4*b* and R6*b*, as will be shown. Thus resistors R4*a* and R6*a* may be provided with relatively low values to assure low input resistance, while resistors R4*b* and R6*b* may be provided with relatively high values to limit the current flow through $V_{EE}$.

Specifically, the value of resistor R4*b* is chosen such that the current therethrough from emitter E3 of transistor Q3 is large compared to any current extended through resistor R4*b* from digit line $\overline{DJ}$ via resistor R4*a*. Thus the voltage drop across resistor R4*b*, and hence the potential at emitter E3 remain substantially constant. Advantageously, then, the input resistance seen by digit line $\overline{DJ}$ is substantially that of resistor R4*a*, independent of that of resistor R4*b*.

In similar fashion, the arrangement including emitter E3 of transistor Q4 and resistors R6*a* and R6*b* advantageously presents a low input resistance to signals on digit line DJ while limiting the current flow to $V_{EE}$.

As mentioned above, in the illustrative sense circuit arrangement in the drawing, the output differential signal of amplifier 20 is extended to output stage 30 to provide an unbalanced signal at terminal TO. In particular, the collectors of output transistors Q3 and Q4 of amplifier 20 are coupled to the bases of transistors Q7 and Q9 of stage 30. Transistors Q7 and Q9 comprise an emitter-coupled differential pair supplied with emitter current by a constant current source. The latter comprises transistor Q11 and resistor R8. Thus when the sense of digit lines DJ and $\overline{DJ}$ is such that the collector of transistor Q4 is at a higher potential than the collector of transistor Q3, most of the current of transistor Q11 flows through transistor Q7. Thus very little current flows from $V_{CC}$ into transistor Q9 via resistor R13 and output bus OB. Accordingly, a first, "high," potential substantially equal to $V_{CC}$ is provided at terminal TO.

If, on the other hand, the signal at the collectors of transistors Q3 and Q4 has the opposite sense to that just assumed, a current path is established from $V_{CC}$ through resistor R13, bus OB and transistor Q9 to constant current source transistor Q11. The potential at terminal TO thus takes on a second, "low," value equal to $V_{CC}$ less the drop across resistor R13.

As mentioned earlier, sense circuit 10 is illustratively a sense circuit for a semiconductor memory. In such an application it may be desired to provide, in known fashion, an expanded memory addressing capability by ganging a plurality of sense circuits to a common bus and effectively disconnecting all but one of the sense circuits from the bus at any given time. A connection from one of such other sense circuits to bus OB is symbolically represented by lead SC.

In the illustrative embodiment, effective connection and disconnection of sense circuit 10 from bus OB are provided by signals on control leads ER and $\overline{ER}$. When the sense of digit lines DJ and $\overline{DJ}$ is to be extended to bus OB, a forward biasing signal for transistor Q11 is provided on lead ER so that a constant current is supplied to the emitters of transistors Q7 and Q9 as described above. At the same time, a reverse-biasing signal for transistor Q8 is provided on lead $\overline{ER}$ so that transistor Q8 is nonconductive.

When it is desired to effectively disconnect sense circuit 10 from bus OB in favor of another sense circuit connected thereto, a reverse-biasing signal for transistor Q11 is provided on lead ER while a forward biasing signal for transistor Q8 is provided on lead $\overline{ER}$. Thus transistor Q11 is rendered nominally nonconductive. Any leakage current through transistor Q11 is steered away from transistor Q9, and hence bus OB, by transistor Q8 which is now conductive.

Transistor Q10 is provided to clamp the collector of transistor Q9 to a minimum voltage of $V_{CC}-V_{BE}$ when the latter transistor is conductive. This prevents transistor Q9 from becoming saturated and helps to provide a rapid response time for sense circuit 10 as a whole by assuring that transistor Q9 can be rapidly switched from conduction to nonconduction.

It is to be understood that the specific circuitry shown and described herein is merely illustrative of the principles of the invention. Thus, for example, while the illustrative embodiment shown in the drawing utilizes bipolar transistors, it will be appreciated that differential amplifiers may be devised in accordance with the principles of the invention utilizing field-effect transistors or other types of known devices.

Thus it will be appreciated that many and other varied arrangements in accordance with the principles of the invention may be devised by those skilled in the art without departing from the spirit and scope thereof.

I claim:

1. A differential amplifier of the type including means responsive to an input signal for generating an intermediate differential signal, characterized by output means operative in response to said input signal for generating an auxiliary signal component in phase with a selected component of said intermediate signal and for combining said auxiliary signal component with said selected intermediate signal component, said output means comprising a transistor having first and second emitters, means for controlling the current in said first emitter in accordance with said selected intermediate signal component and means operative in response to said input signal for varying the current in said second emitter in phase with the current in said first emitter to generate said auxiliary signal component.

2. A differential amplifier in accordance with claim 1 wherein said input signal comprises a pair of differential components and wherein said output means further comprises impedance means for connecting said second emitter to a source of potential and means for applying to said second emitter a component of said input signal which is in phase with said selected intermediate signal component.

3. A differential amplifier in accordance with claim 2 wherein said transistor further includes a third emitter and wherein said impedance means includes a first impedance connecting said second emitter to said third emitter and a second impedance connecting said third emitter to said source of potential.

4. A differential amplifier including, first means responsive to an input signal for generating an intermediate signal having a first pair of out-of-phase components, second means responsive to said input signal for generating an auxiliary signal having a second pair of out-of-phase components; and means for summing each of said intermediate signal components with one of said auxiliary signal components in phase therewith, said summing means including a pair of transistors each having first and second emitters, means for applying each of said intermediate signal components to a different one of said first emitters, and means for applying each of said auxiliary signal components to a different one of said second emitters.

5. A differential amplifier comprising means responsive to an input differential signal for generating an intermediate differential signal, a pair of output transistors each having first and second emitters, means for applying each component of said intermediate signal to a first emitter of a respective one of said output transistors, and means for applying to a second emitter of each said output transistor a component of said input signal in phase with the intermediate signal component applied to the first emitter thereof.

6. A differential amplifier in accordance with claim 5 wherein each of said output transistors includes a third emitter, said amplifier further comprising impedance means for connecting said second emitter of each of said output transistors to said third emitter thereof and for connecting said third emitter of each of said output transistors to a source of potential.

7. A differential amplifier in accordance with claim 6 wherein said intermediate signal generating means includes an emitter-coupled transistor pair and means for applying the respective components of said input signal to the bases of said emitter-coupled pair, the collectors of said emitter-coupled pair each being connected to the first emitter of a respective one of said output transistors.

8. A differential amplifier comprising, first and second emitter-coupled input transistors, first and second output transistors each having at least first and second emitters, means for coupling the collector of said first input transistor to the first emitter of said first output transistor, means for coupling the collector of said second input transistor to the first emitter of said second output transistor, means for extending a first input differential signal component to the base of said first input transistor and to the second emitter of said second output transistor, and means for extending a second input differential signal component to the base of said second input transistor and to the second emitter of said first output transistor.

9. A differential amplifier in accordance with claim 8 further comprising means for connecting the collectors of each of said output transistors to a first source of potential, impedance means for connecting the second emitters of each of said output transistors to a second source of potential, and means for maintaining the bases of each of said output transistors at a substantially fixed potential.

10. A differential amplifier in accordance with claim 9 wherein each of said output transistors includes a third emitter and wherein said impedance means includes means for connecting the second emitter of each of said output transistors to the third emitter thereof and means for connecting the third emitter of each of said output transistors to said second source of potential.

* * * * *